(12) United States Patent
Hasegawa

(10) Patent No.: US 12,315,778 B2
(45) Date of Patent: May 27, 2025

(54) GRAPHITE THIN FILM/SILICON SUBSTRATE LAMINATED ASSEMBLY, PROCESS FOR PRODUCING THE SAME, AND SUBSTRATE FOR ENHANCED HEAT DISCHARGE TYPE ELECTRONIC DEVICES

(71) Applicant: NATIONAL INSTITUTE OF ADVANCED INDUSTRIAL SCIENCE AND TECHNOLOGY, Tokyo (JP)

(72) Inventor: Masataka Hasegawa, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 940 days.

(21) Appl. No.: 17/288,766

(22) PCT Filed: Dec. 25, 2019

(86) PCT No.: PCT/JP2019/050910
§ 371 (c)(1),
(2) Date: Apr. 26, 2021

(87) PCT Pub. No.: WO2020/138202
PCT Pub. Date: Jul. 2, 2020

(65) Prior Publication Data
US 2021/0407883 A1 Dec. 30, 2021

(30) Foreign Application Priority Data
Dec. 28, 2018 (JP) .................................. 2018-246592

(51) Int. Cl.
*H01L 23/373* (2006.01)
*B32B 9/00* (2006.01)
(Continued)

(52) U.S. Cl.
CPC ............ *H01L 23/373* (2013.01); *B32B 9/007* (2013.01); *H01L 24/80* (2013.01); *H10D 62/83* (2025.01);
(Continued)

(58) Field of Classification Search
CPC ....... H01L 23/373; H01L 24/80; H01L 29/16; H01L 2224/80013; H01L 2224/80031; H01L 2224/80047; B32B 9/007
See application file for complete search history.

(56) References Cited

U.S. PATENT DOCUMENTS 9,807,878 B2    10/2017 Tatami et al.
10,357,942 B2    7/2019 Nishikawa et al.
(Continued)

FOREIGN PATENT DOCUMENTS

JP    H05892 A    *  1/1993    ............. C30B 29/04
JP    09315808 A    *  12/1997    ............. C01B 32/20
(Continued)

OTHER PUBLICATIONS

Translation of JP 2009200177. (Year: 2009).*
(Continued)

*Primary Examiner* — Catherine A. Simone
(74) *Attorney, Agent, or Firm* — HAUPTMAN HAM, LLP

(57) ABSTRACT

The invention provides a laminated assembly dedicated to an enhanced heat discharge type electronic device application by providing an enhanced thermal performance to a silicon device. A graphite thin film/silicon substrate laminated assembly is provided by cleaning the surfaces of a smoothed graphite thin film and a silicon substrate under deaeration conditions for activation, thereby bringing them close to each other for spontaneous bonding. In such a laminated assembly wherein the graphite thin film is pro-
(Continued)

vided on the silicon substrate, the silicon substrate and graphite thin film come into contact directly via an interface.

11 Claims, 4 Drawing Sheets

(51) Int. Cl.
  *H01L 23/00* (2006.01)
  *H10D 62/83* (2025.01)
(52) U.S. Cl.
  CPC ............... *H01L 2224/80013* (2013.01); *H01L 2224/80031* (2013.01); *H01L 2224/80047* (2013.01)

(56) References Cited

U.S. PATENT DOCUMENTS

| | | |
|---|---|---|
| 2010/0009193 A1 | 1/2010 | Takeda et al. |
| 2010/0320445 A1 | 12/2010 | Ogihara et al. |
| 2010/0323164 A1 | 12/2010 | Ogihara et al. |
| 2013/0266739 A1* | 10/2013 | Lin .................... C23C 14/34 427/535 |
| 2020/0402850 A1 | 12/2020 | Murakami et al. |

FOREIGN PATENT DOCUMENTS

| | | |
|---|---|---|
| JP | H10-92702 A | 4/1998 |
| JP | 4182323 B2 | 11/2008 |
| JP | 2008-294110 A | 12/2008 |
| JP | 2009-200177 A | 9/2009 |
| JP | 2011-006265 A | 1/2011 |
| JP | 2011-009268 A | 1/2011 |
| JP | 2014-011301 A | 1/2014 |
| JP | 2017-28247 A | 2/2017 |
| JP | 2018-163816 A | 10/2018 |
| JP | 2019-210161 A | 12/2019 |
| JP | 2019-210162 A | 12/2019 |
| WO | 2008/078679 A1 | 7/2008 |
| WO | 2015/045641 A1 | 4/2015 |
| WO | 2018/016350 A1 | 1/2018 |
| WO | 2019/172023 A1 | 9/2019 |

OTHER PUBLICATIONS

Translation of JP2014011301. (Year: 2014).*
Translation of JPH09315808A (bib, description and claims). (Year: 2007).*
Translation of JPH05892A (bib, description and claims). (Year: 1993).*
PCT/ISA/210, "International Search Report for International Application No. PCT/JP2019/050910," Feb. 4, 2020.

* cited by examiner

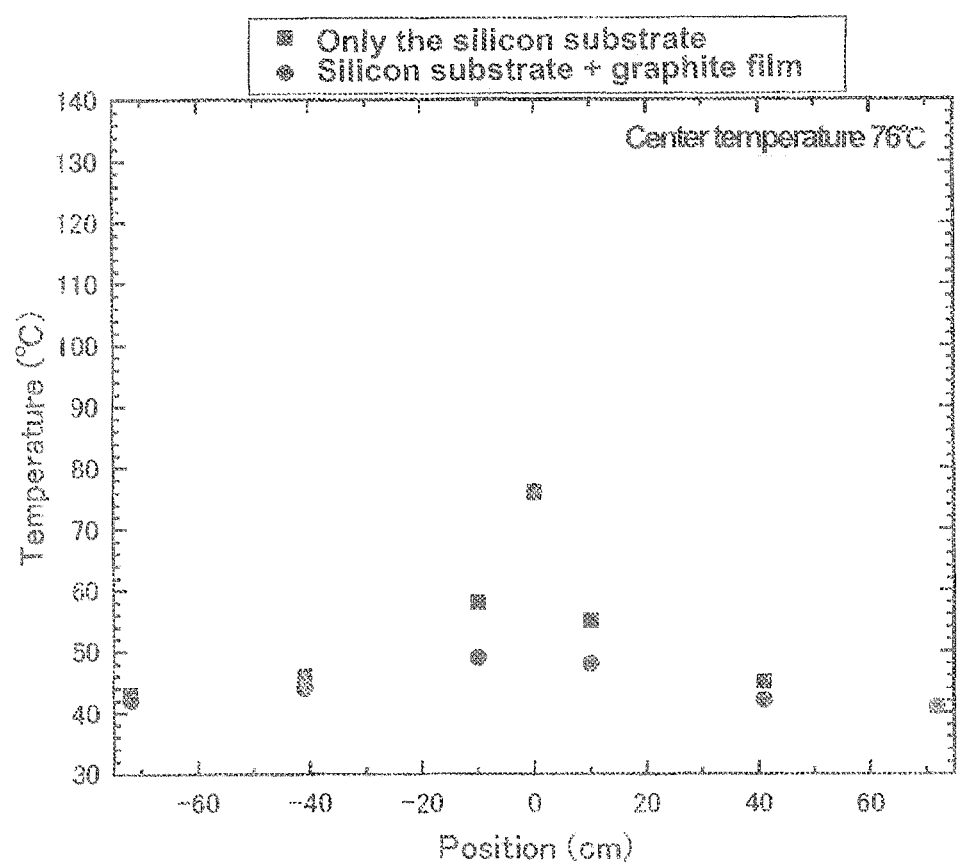

GRAPHITE THIN FILM/SILICON SUBSTRATE LAMINATED ASSEMBLY, PROCESS FOR PRODUCING THE SAME, AND SUBSTRATE FOR ENHANCED HEAT DISCHARGE TYPE ELECTRONIC DEVICES

RELATED APPLICATIONS

The present application is National Phase of International Application No. PCT/JP2019/050910 filed Dec. 25, 2019, and claims priority from Japanese Application No. 2018-246592, filed Dec. 28, 2018, the disclosure of which is hereby incorporated by reference herein in its entirety.

TECHNICAL FIELD

The present invention relates to a laminated assembly comprising a graphite thin film and a silicon substrate, a process for producing the same, and a substrate for power devices using the same, and more specifically to a laminated assembly dedicated to an enhanced heat discharge type electronic device application wherein a graphite thin film that is an enhanced heat conductive member is laminated onto a silicon substrate that is an electronic device material by direct bonding without recourse to any adhesive.

BACKGROUND ART

Green electronics is an energy management due to introduction of ubiquitous power electronics equipment. To this end, there is the need for introduction of power electronics equipment wherein POL (Point Of Load) is used to leave its presence unnoticeable everywhere and by every class. To meet such a requirement, there is the need for a high power density power converter that is the key to multistage power conversion. One seed of technology required to achieve this is a high-density heat dissipation technology that allows for efficient dissipation of generated heat due to high power densities. A graphite film having extremely high heat conduction characteristics is used as a heat dissipation material for small personal devices such as smart phones; if this graphite film is incorporated into the structure of a silicon device, it is then possible to discharge heat on micro levels, which would contribute more to the realization of high power-density power converters for supporting ubiquitous power electronics. Disclosed herein is a laminated assembly that comprises a graphite thin film that is a high heat conduction material and a silicon substrate that is an electronic device material—a key element to this end.

So far, there has been a report of a bonded assembly wherein a carbon based substrate and a silicon substrate are bonded together via an amorphous silicon or silicon carbide layer bonding surface (Patent Publication 1). According to this bonded arrangement, the bonding surface is molten to form a layer comprising a compound of silicon and carbon. This process is advantageous for the production of a large-sized composite substrate.

There is another report of a composite material comprising a high crystalline graphite substrate bonded to a silicon substrate (Patent Publication 2). This composite material comprises a graphite substrate having a thickness of about 4 μm, a silicon substrate, and an intermediate layer positioned between the graphite and silicon substrates with a thickness of 2 μm to 30 μm, wherein the intermediate layer comprises a bonded material containing oxygen, carbon and silicon. In the process used to obtain a bonded assembly, graphite and silicon are laminated together, and heated and pressed in an atmosphere having an oxygen concentration of 0.2% by volume at a temperature of 1260° C. or higher under a pressure of 24.5 MPa or higher.

There is yet another report of a novel graphite sheet having enhanced carrier mobility characteristics and higher resistant characteristics to current density than those of conventional copper wiring and its manufacturing process as well as a laminated sheet for wiring (Patent Publication 3). This laminated sheet for wiring is obtained by laminating a graphite sheet having a thickness of 1.2 μm onto a polyimide insulating sheet having a thickness of 12 μm via a modified acrylic adhesive sheet having a thickness of 25 microns using a heat laminator at 150° C.

PRIOR ARTS

Patent Publications

Patent Publication 1: U.S. Pat. No. 4,182,323
Patent Publication 2: JP(A) 2017-28247
Patent Publication 3: WO2015/045641

SUMMARY OF THE INVENTION

Objects of the Invention

As a result of studies made of a conventional laminated assembly comprising a graphite thin film (carbon-based substrate) and a silicon substrate as described above, the inventor has come across such problems as mentioned just below.

(1) As described in the reports mentioned above, the lamination of a graphite thin film and a silicon substrate is carried out via the intermediate layer or adhesive; nothing is said of any direct lamination. The intermediate layer or adhesive hinders the delivery of heat generated in the silicon substrate to the graphite thin film that is a heat discharge material. In other words, it is desired that direct lamination be carried out without recourse to any intermediate layer or adhesive.

(2) The aforesaid problem (1) is a great obstacle to the application of the improved thermal characteristics of a graphite thin film to a laminated assembly for an enhanced heat discharge type electronic device in order to solve or mitigate the thermal problem with a silicon device.

Having been achieved with the background of the inventor's understanding of such prior arts and problems as mentioned above, the present invention relates to a laminated assembly obtained by the lamination of a graphite thin film and a silicon substrate that is an electronic device material without recourse to any intermediate layer or adhesive and designed for use in an enhanced heat discharge type electronic device, and further to its production process.

EMBODIMENTS OF THE INVENTION

As a result of study for achieving the abovementioned objects, the inventor has found that a laminated assembly is obtainable by the lamination of a graphite thin film and a silicon substrate without recourse to any intermediate layer or adhesive. This laminated assembly has higher heat conduction properties as compared with a silicon substrate, and lends itself to an enhanced heat discharge type electronic device such as a power device.

More specifically, the present invention provides a process for producing a laminated assembly comprising a graphite thin film and a silicon substrate by giving the graphite thin film onto the silicon substrate, characterized in that the graphite thin film smoothed on its surface and the silicon substrate are activated on the respective surfaces by cleaning under deaeration conditions, allowing the surfaces to be close to each other for spontaneous bonding.

In one embodiment, the present invention may be characterized in that prior to deaeration, the surface of the graphite thin film is smoothed by chemical-mechanical polishing (CMP). In one embodiment, the present invention may be characterized in that the surface of the graphite thin film is smoothed in such a way as to have an average roughness Ra of 1 nm or less.

In one embodiment, the present invention may be characterized in that a support substrate is removably attached to a major surface of the graphite thin film opposite to the aforesaid surface.

In another embodiment, the present invention may be characterized in that cleaning is carried out by plasma cleaning under non-heating, and in that the plasma cleaning is carried out by argon plasma.

In a further embodiment, the present invention may be characterized in that the silicon substrate comprises silicon having an oxidized film attached thereto, and the oxidized film is removed by the cleaning.

The present invention also provides a laminated assembly comprising a graphite thin film and a silicon substrate wherein the graphite thin film is provided onto the silicon substrate, characterized in that the silicon substrate and the graphite thin film are contiguous to each other directly with an interface between them.

In one embodiment, the present invention may be characterized in that the silicon substrate and the graphite thin film are bonded together by Van der Waals force.

Further, the present invention provides a substrate for an enhanced heat discharge type electronic device in which a graphite thin film is given onto a silicon substrate, characterized in that the silicon substrate and the graphite thin film are contiguous to each other directly with an interface between them.

Advantages of the Invention

The laminated assembly comprising a graphite thin film and a silicon substrate according to the present invention is produced by the lamination of a graphite thin film that is an enhanced heat conduction member and a silicon substrate that is an electronic device material without recourse to any intermediate layer or adhesive. For instance, the present laminated assembly can be used as a basic element of an enhanced heat discharge type electronic device so that the enhanced heat discharge type electronic device can be produced.

BRIEF EXPLANATION OF THE DRAWINGS

In FIG. 4, (1) stands for a site where the graphite thin film is peeled off in a position close to the end (corner) of the substrate; (2) stands for a site where the graphite thin film is peeled off in a position spaced about 2 mm away from the corner of the substrate; and (3) stands for a site where the graphite thin film is not peeled off, respectively.

In FIG. 6, (a) stands for specific relations between a phase difference θ of response temperatures at a heating frequency 10 Hz and a distance L from a heating point (position of irradiation of laser light).

FIG. 8 is a graphical view on the basis of plotting the surface temperature of the silicon substrate of the laminated assembly comprising a graphite thin film and a silicon substrate according to one embodiment of the invention upon heating relative to a distance from the center.

MODES FOR CARRYING OUT THE INVENTION

Figure 1:
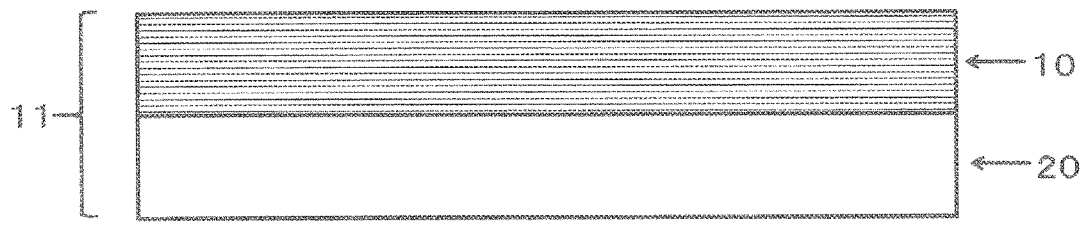
FIG. 1 is a sectional schematic view of the laminated assembly comprising a graphite thin film and a silicon substrate according to one embodiment of the invention.

In general, the present invention includes such embodiments as mentioned just below.

[1] A graphite thin film/silicon substrate laminated assembly formed by lamination of a graphite thin film and a silicon substrate without recourse to any intermediate layer or adhesive.

[2] The graphite thin film/silicon substrate laminated assembly of [1], wherein a portion of the graphite thin film remains on the surface of the silicon substrate at a site where the graphite thin film is peeled off from the graphite thin film/silicon substrate laminated assembly.

[3] The graphite thin film/silicon substrate laminate of [1], wherein the graphite thin film is found to remain through observation of Raman spectra caused by graphite as a result of Raman spectrometry of the surface of the silicon substrate on a site where the graphite thin film is peeled off from the graphite thin film/silicon substrate laminated assembly.

[4] The graphite thin film/silicon substrate laminated assembly of [1], wherein the graphite thin film and the silicon substrate are laminated together without recourse to any intermediate layer or adhesive, and there is no silicon carbide formed on the lamination interface.

[5] A silicon substrate/graphite thin film/silicon substrate laminated assembly formed by lamination of a graphite thin film and a silicon substrate without recourse to any intermediate layer or adhesive.

[6] The silicon substrate/graphite thin film/silicon substrate laminated assembly of [5], wherein when the silicon substrate/graphite thin film laminate is separated by peeling into the respective layers, the graphite thin film remains on the surface of the silicon substrate.

[7] The silicon substrate/graphite thin film/silicon substrate laminated assembly of [5], wherein the graphite thin film is found to remain through observation of Raman spectra caused by graphite as a result of Raman spectrometry of the surface of the silicon substrate when the silicon substrate/graphite thin film/silicon substrate laminated assembly is separated by peeling into the respective layers.

[8] A laminated assembly of silicon substrate/graphite thin film/silicon substrate having an oxidized film attached thereto, wherein the graphite thin film, silicon substrate, and silicon substrate having an oxidized film attached thereto are laminated one upon another without recourse to any intermediate layer or adhesive.

[9] The laminated assembly of silicon substrate/graphite thin film/silicon substrate having an oxidized film attached thereto according to [8], wherein the graphite thin film remains on the surface of the silicon substrate and the surface of the silicon substrate having an oxidized film attached thereto when the laminated assembly comprising a silicon substrate, a graphite thin film, and a silicon substrate having an oxidized film attached thereto is separated by peeling into the respective layer.

[10] The laminated assembly of silicon substrate/graphite thin film/silicon substrate having an oxidized film attached thereto according to [8], wherein the graphite thin film is found to remain through observation of Raman spectra caused by graphite as a result of Raman spectrometry of the surface of the silicon substrate and the silicon substrate having an oxidized film attached thereto when the laminated assembly comprising a silicon substrate/graphite thin film/silicon substrate having an oxidized film attached thereto is separated by peeling into the respective layers.

[11] A process for producing the graphite thin film/silicon substrate according to any one of [1] to [4], wherein the graphite thin film and the silicon substrate are laminated without recourse to any intermediate layer or adhesive.

[12] A process for producing the silicon substrate/graphite thin film/silicon substrate according to any one of [5] to [7], wherein the graphite thin film and the silicon substrate are laminated one upon another without recourse to any intermediate layer or adhesive.

[13] A process for producing the laminated assembly of silicon substrate/graphite thin film/silicon substrate having an oxidized film attached thereto according to any one of [8] to [10], wherein the graphite thin film, silicon substrate and silicon substrate having an oxidized film attached thereto are laminated one upon another without recourse to any intermediate layer or adhesive.

The laminated assembly comprising a graphite thin film and a silicon substrate, the laminated assembly comprising a silicon substrate, a graphite thin film and a silicon substrate, and the laminated assembly comprising a silicon substrate, a graphite thin film and a silicon substrate having an oxidized film attached thereto according to the invention as well as the production process of the same are now explained with reference to some embodiments and examples. Optionally, the same expressions or wordings are not repeated. It is here noted that when a numerical scope is described by inserting "to" between two numerals, two such numerals are to be included in this numerical scope.

Figure 2:
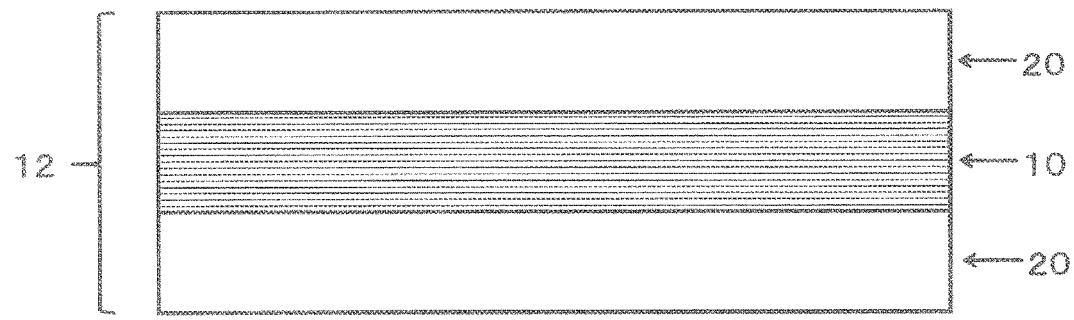
FIG. 2 is a sectional schematic view of the laminated assembly comprising a silicon substrate, a graphite thin film and a silicon substrate according to one embodiment of the invention.
Figure 3:
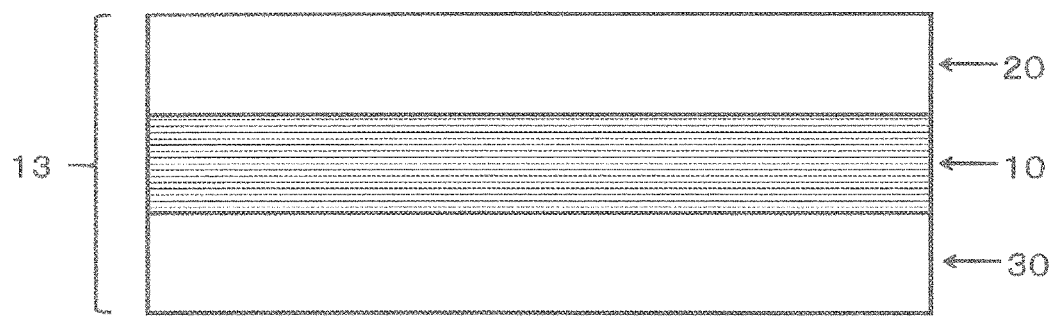
FIG. 3 is a sectional schematic view of the laminated assembly comprising a silicon substrate, a graphite thin film, and a silicon substrate having an oxidized film attached thereto according to one embodiment of the invention.

FIG. 1 is illustrative of a laminated assembly 11 comprising a graphite thin film and a silicon substrate according to one embodiment of the invention. The laminated assembly comprises a graphite thin film 10 and a silicon substrate 20. FIG. 2 is illustrative of a laminated assembly 12 comprising a silicon substrate, a graphite thin film and a silicon substrate according to one embodiment of the invention. The laminated assembly comprises a graphite thin film 10 and silicon substrates 20. FIG. 3 is illustrative of a laminate assembly 13 comprising a silicon substrate, a graphite thin film, and a silicon substrate having an oxidized film attached thereto according to one embodiment of the invention. The laminated assembly 13 comprises a graphite thin film 10, a silicon substrate 20, and a silicon substrate 30 having an oxidized film attached thereto.

The process for producing each of these laminated assemblies is now successively explained.

Example of Producing a Graphite Thin Film/Silicon Substrate Laminated Assembly

The laminated assembly 11 comprising a graphite thin film and a silicon substrate is obtained by a lamination process wherein the graphite thin film smoothed by chemical-mechanical polishing (CMP) on its surface is directly bonded onto the silicon substrate with the use of a normal-temperature bonding device, as described below in details.

For the preparation of the laminated assembly comprising the graphite thin film and the silicon substrate, a PGS graphite sheet manufactured by Panasonic Corporation was used. The PGS graphite sheet has a thickness of 100 μm, a size of 180 mm×230 mm, a density of 0.85 g/cm$^3$, a heat conductivity of 700 W/m·k in a planar direction, an electrical conductivity of 10000 S/cm, a tensile strength of 20.0 MPa, a linear expansion coefficient of $9.3\times10^{-7}$/k in a planar direction, and a linear expansion coefficient of $3.2\times10^{-5}$/k in a thickness direction. This graphite sheet was cut out in a circular shape having a diameter of 150 mm, and then affixed onto a silicon substrate having a diameter of 150 mm and a thickness of 625 μm with the aid of a double-sided tape. The silicon substrate is a support substrate adapted to polish the graphite thin film and to bond it onto the silicon substrate. The graphite thin film was smoothed on its surface by means of CMP, and finished to a surface roughness of up to 1 nm (0.001 μm) or less in terms of JIS arithmetic mean roughness Ra.

Lamination of the graphite thin film polished and smoothed by CMP on the surface and the silicon substrate by means of direct bonding was carried out using a normal-temperature wafer bonding apparatus BOND MEISTER MWB-06-R manufactured by Mitsubishi Heavy Industries Machine Tool Co., Ltd. While the graphite thin film polished by CPM remained affixed to the silicon substrate using the double-sided tape, it was loaded in the bonding chamber of the normal-temperature wafer bonding apparatus. Further, the silicon substrate onto which the graphite thin film was to be laminated by direct bonding was loaded in the bonding chamber. Then, the bonding chamber was evacuated down to the order of $10^{-6}$ Pa. In the bonding chamber, the surface of the graphite thin film and the surface of the silicon substrate were then irradiated with neutral argon atoms for removal of surface oxidized films and adsorbates, leading to activation of both the surfaces. This plasma activation process allows the "atomic bond" the materials have inherently to turn up, facilitating spontaneous bonding due to Van der Waals force.

The graphite thin film and silicon substrate activated on their surfaces in the activation process were aligned in position within the bonding chamber, followed by contact of the surface of the graphite thin film with the surface of the silicon substrate. Instantaneously upon contact of both the surfaces, bonding force worked so that the graphite thin film was firmly bonded to the silicon substrate.

In the aforesaid lamination process comprising a series of direct bonding steps, it is noted that both the graphite thin film and the silicon substrate were neither heated nor cooled. In other words, both the surfaces were brought into contact and laminated one upon another by direct bonding at room or normal temperature.

The graphite thin film and silicon substrate going through the lamination process by direct bonding was then taken out of the normal-temperature bonding apparatus. In this case, the silicon substrate adapted to support the graphite thin film remained affixed to the graphite thin film by virtue of the double-sided tape; the laminated assembly comprised the silicon substrate adapted to support the graphite thin film in place, the double-sided tape, the graphite thin film, and the silicon substrate. Then, this laminated assembly was immersed or dipped in an organic solvent (isopropyl alcohol) to remove the adhesive force of the double-sided tape for removal of the graphite thin film-supporting silicon substrate. Through the aforesaid process there was a laminated assembly obtained which comprised a graphite thin film and a silicon substrate.

Measurement of Thickness

The thickness of the thus formed laminated assembly comprising the graphite thin film and the silicon substrate was measured. This measurement was carried out using a micrometer. Prior to bonding, the silicon substrate had a thickness of 624 µm and the graphite thin film had a thickness of 100 µm. Formed through the lamination process involving polishing of the graphite thin film by CMP and direct bonding, the laminated assembly comprising the graphite thin film and the silicon substrate had a thickness of 643 µm. It was thus found that the thickness of the graphite thin film was 19 µm because the silicon substrate was not polished; its thickness was invariable before and after bonding. It was accordingly found that the amount of polishing of the graphite thin film herein is 81 µm. In the formed laminated assembly comprising the graphite thin film and the silicon substrate, the graphite thin film had a thickness of 19 µm and the silicon substrate had a thickness of 624 µm.

Raman Spectrometry for the Estimation of Adhesion

Figure 4:
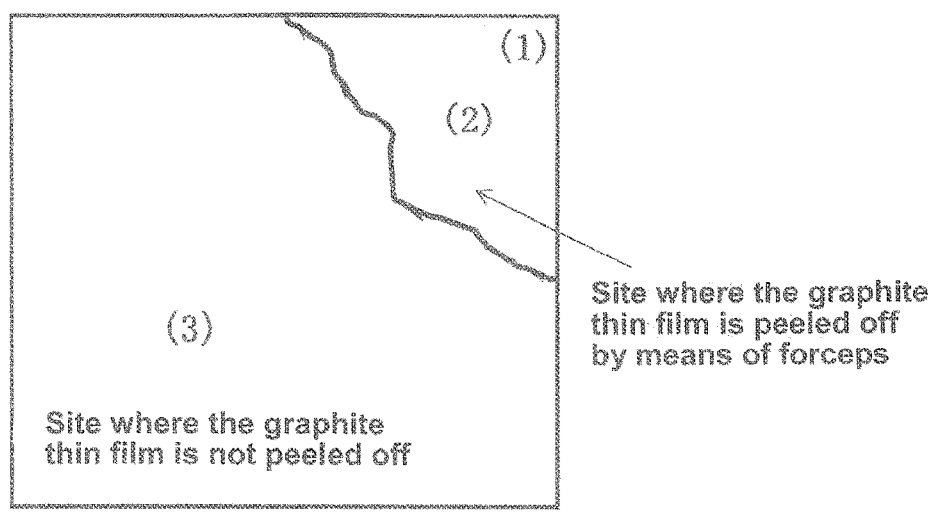
FIG. 4 shows locations where Raman spectra are measured of the laminated assembly comprising a graphite thin film and a silicon substrate according to one embodiment of the invention while it is partially peeled off by forceps or not.
Figure 5:
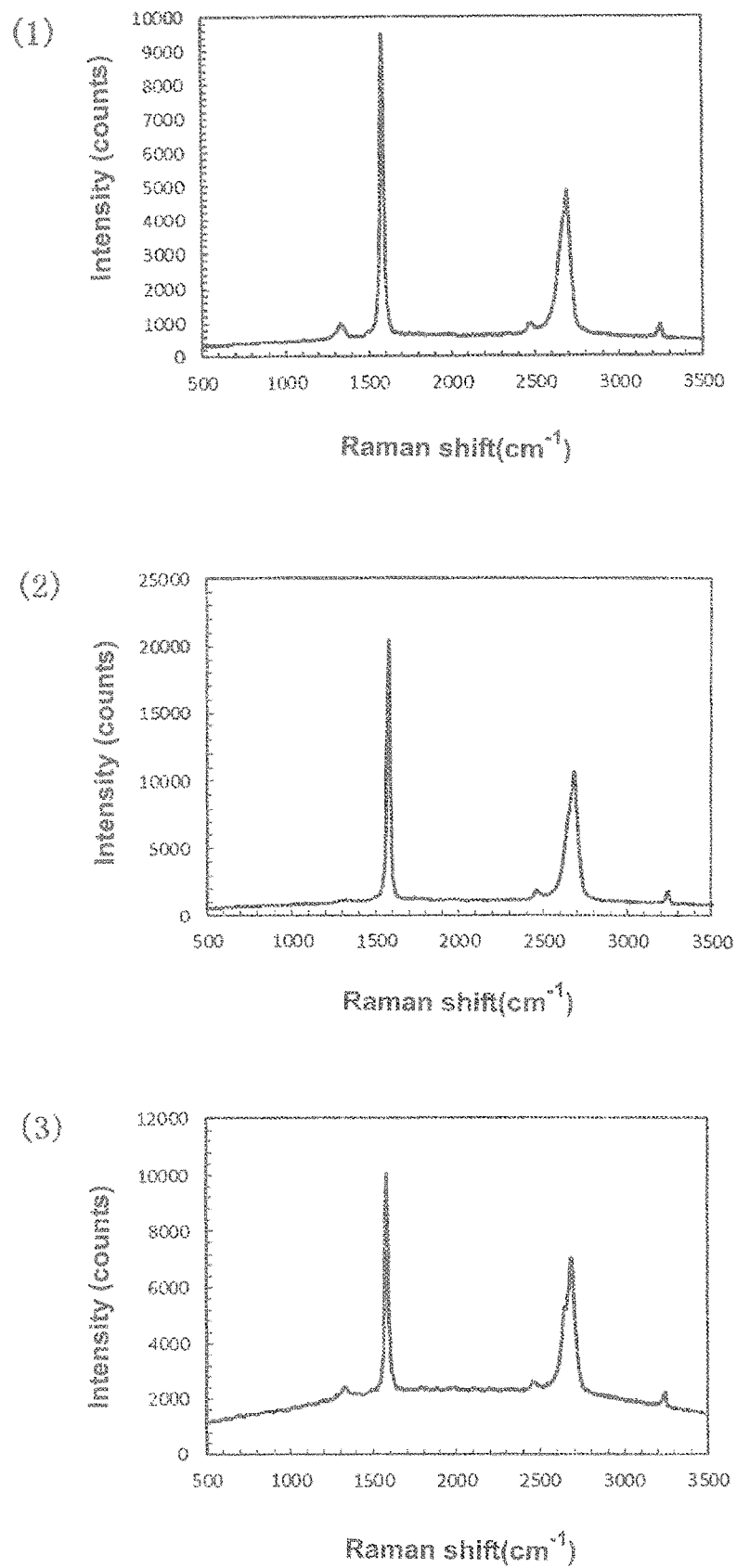
FIG. 5 shows Raman spectra measured with the graphite thin film peeled off, or not, from the laminated assembly comprising a graphite thin film and a silicon substrate according to one embodiment of the invention. Note here that (1), (2) and (3) in FIG. 5 are synonymous with (1), (2) and (3) in FIG. 4.

In order to identify the bonding strength (adhesion) of the graphite thin film/silicon substrate laminated assembly according to the invention, such experimentation as mentioned just below was carried out. The graphite thin film/silicon substrate laminated assembly having a diameter of 150 mm was cut into a 20 mm square small piece using a dicing apparatus. The graphite thin film was picked up and peeled off from a site about 5 mm away from the small piece by means of forceps. The surface of the site of the silicon substrate out of which the graphite thin film was peeled off was measured by Raman spectroscopy. The laser used for excitation has a wavelength of 638 nm, and laser light has a spot diameter of 1 µm. As shown in FIG. 4, Raman spectrometry was carried out on the endmost (corner) site (1) of the substrate where the graphite thin film was peeled off, and on a site (2) spaced about 2 mm away from the corner site. Raman spectroscopy of the surface of the graphite thin film was also carried out on a site (3) where the graphite thin film was not peeled off. FIG. 5 is indicative of Raman spectra observed on three such sites: (1), (2) and (3).

Spectra observed on site (3) where the graphite thin film was not peeled off are found to have outstanding peaks at 1579 $cm^{-1}$ and 2687 $cm^{-1}$; the peak at 1579 $cm^{-1}$ is a G band of graphite and the peak at 2687 $cm^{-1}$ is a 2D band of graphite or a typical Raman spectrum obtained from high-quality graphite. A D band indicative of deficiency was also observed in the vicinity of 1321 $cm^{-1}$. Referring now to Raman spectra on sites (1) and (2) where the graphite thin film was peeled off, peaks of the G band and 2D band were clearly observed as was the case with site (3). This result shows that the graphite thin film remains on the surface of the silicon substrate on the sites where the graphite thin film is peeled off from the formed laminated assembly comprising the graphite thin film and the silicon substrate by means of forceps. In other words, it has become clear that during peeling of the graphite thin film by means of forceps, interlayer peeling of the graphite thin layer takes place, meaning that there is no peeling of the bonding interface of the graphite thin film and silicon substrate. In the thus formed laminated assembly comprising the graphite thin film and the silicon substrate, it has been clear the strength of bonding of the graphite to the silicon substrate surface is greater than the interlayer bonding strength of the graphite thin film. Accordingly, the bonding strength of the laminated assembly comprising the graphite thin film and the silicon substrate would be strong enough.

Identification of Whether or not SiC is Formed at the Interface

It was identified whether or not silicon carbide SiC was formed at the lamination interface of the inventive laminated assembly comprising the graphite thin film and the silicon substrate due to direct bonding. The Raman peaks of 3C—SiC in the LO and TO modes are observed at 969 $cm^{-1}$ and 793 $cm^{-1}$, respectively, and the Raman peaks of 4H—SiC in the LO and TO modes are observed at 969 $cm^{-1}$ and 793 $cm^{-1}$, respectively. In the Raman spectra of sites (1) and (2) where the graphite thin film was peeled off as shown in FIG. 5, on the other hand, no such Raman peaks were observed. From these results, it has been found that there is no silicon carbide SiC formed at the lamination interface of the inventive laminated assembly comprising the graphite thin film and the silicon substrate due to direct bonding.

Thermal-Diffusivity Measurements of the Graphite Thin Film/Silicon Substrate by a Periodic Heating Method The thermal diffusivity of the graphite thin film/silicon substrate laminated assembly formed herein was measured by a periodic heating method wherein heat flow energy having a periodically modulated strength is given to a sample under measurement to determine a thermal diffusivity from an amplitude or phase difference of temperature response in a position away from a heating area by a given distance. Joule heat of laser light or a heater is used as the heat flow energy, and then given to the sample while periodically modulated. Heating by irradiation of laser light was herein used. For detection of temperature response, a temperature sensor (e.g., a thermocouple) or a thermoreflectance method may be used. In the measurement here, however, non-contact temperature measurement was carried out using a radiation thermometer. For details of the thermal diffusivity measurements by a periodic heating method, see H. Kato, T. Baba, M. Okaji, "Anisotropic thermal-diffusivity measurements by a new laser-spot-heating technique", Meas Sci Technol 12(2001) 2074-2080.

Figure 6:
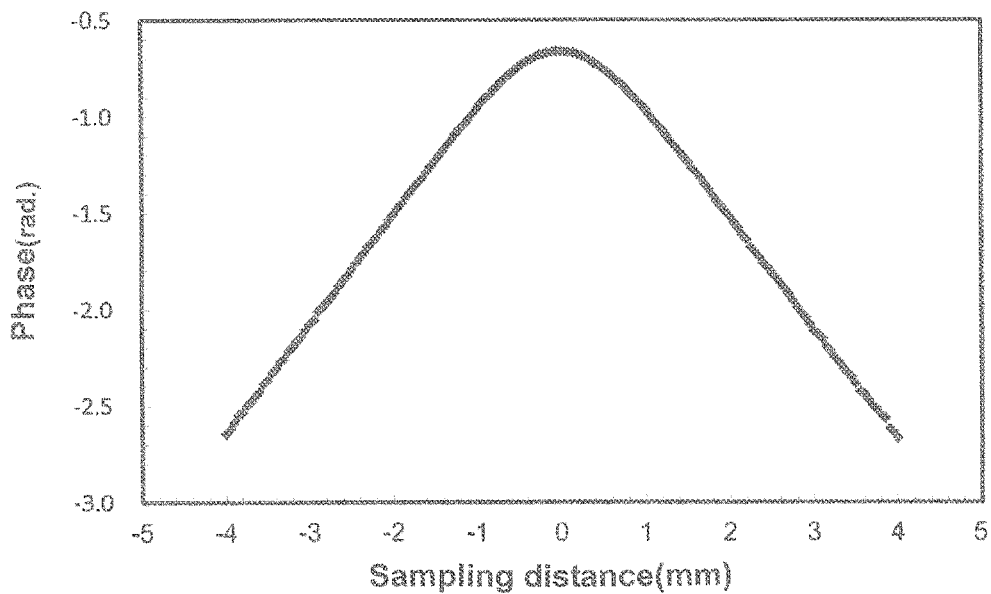
FIG. 6 shows the thermal diffusivity of the laminated assembly comprising a graphite thin film and a silicon substrate according to one embodiment of the invention as measured by a periodic heating method.

The graphite thin film/silicon substrate laminated assembly measured here had a 20 mm square size with a graphite thin film thickness of 19 μm and a silicon substrate thickness of 624 μm. The results of measurement are shown in FIG. 6 with distance L from a heating point (irradiation position of laser light) as abscissa and a phase difference θ of temperature response with ordinate. Heating laser was applied to the central portion of the surface on the silicon substrate side of the laminated assembly comprising the graphite thin film and the silicon substrate. The heating frequency is 10 Hz. There is a specific relation found between the thermal diffusivity α and the phase difference θ, as represented by the following equation (1). Using this relation, the thermal diffusivity α is determined from the positive and negative areas of L, respectively. The resultant thermal diffusivity α was $9.7\times10^{-5}$ m$^2$/s. From the fact that the thermal diffusivity of a single silicon substrate having no graphite thin film was $8.8\times10^{-5}$ m$^2$/s, it has been clear that the thermal diffusivity of the graphite thin film/silicon substrate laminated assembly is about 10% higher than that of the single silicon substrate.

$$\theta = |L|\sqrt{\frac{\pi f}{\alpha}} \quad (I)$$

Example of Preparing a Silicon Substrate/Graphite Thin Film/Silicon Substrate Laminated Assembly A laminated assembly comprising a silicon substrate, a graphite thin film and a silicon substrate is obtained by a process wherein a graphite thin film smoothed on its surface by means of chemical-mechanical polishing (CMP) is laminated onto a silicon substrate by direct bonding using a normal-temperature bonding apparatus, and the graphite thin film laminated by direct bonding is then smoothed by chemical-mechanical polishing (CMP) on its surface and further laminated onto another silicon substrate with the use of a normal-temperature bonding apparatus, as detailed just below.

For the preparation of the laminated assembly comprising the silicon substrate, the graphite thin film and the silicon substrate, a PGS graphite sheet manufactured by Panasonic Corporation was used. The PGS graphite sheet has a thickness of 100 μm, a size of 180 mm×230 mm, a density of 0.85 g/cm$^3$, a heat conductivity of 700 W/m·k in a planar direction, an electrical conductivity of 10000 S/cm, a tensile strength of 20.0 MPa, a linear expansion coefficient of $9.3\times10^{-7}$/k, and a linear expansion coefficient of $3.2\times10^{-5}$/k in a thickness direction. This graphite sheet was cut out in a circular shape having a diameter of 100 mm, and then affixed onto a silicon substrate having a diameter of 100 mm and a thickness of 524 μm with the aid of a double-sided tape. The silicon substrate is a support substrate adapted to polish the graphite thin film and to bond it onto the silicon substrate. The graphite thin film was smoothed on its surface by means of CMP, and finished to a surface roughness of 1 nm (0.001 μm) or less in terms of JIS arithmetic mean roughness Ra.

Lamination of the graphite thin film polished and smoothed by CMP on the surface and the silicon substrate by means of direct bonding was carried out using a bonding apparatus BOND MEISTER MWB-06-R: a normal-temperature wafer bonding apparatus manufactured by Mitsubishi Heavy Industries Machine Tool Co., Ltd. While the graphite thin film polished by CPM remained affixed to the silicon substrate using the double-sided tape, it was loaded in the bonding chamber of the normal-temperature wafer bonding apparatus. Further, the silicon substrate having a diameter of 100 mm and a thickness of 524 μm, onto which the graphite thin film was laminated by direct bonding, was loaded in the bonding chamber. Then, the bonding chamber was evacuated down to the order of 10$^{-6}$ Pa. In the bonding chamber, the surface of the graphite thin film and the surface of the silicon substrate were then irradiated with neutral argon atoms for removal of surface oxidized films and adsorbates, leading to activation of both the surfaces. This plasma activation process allows the "atomic bond" the materials have inherently to turn up, facilitating spontaneous bonding due to Van der Waals force.

The graphite thin film and silicon substrate activated on their surfaces in the activation process were aligned in position within the bonding chamber, followed by contact of the surface of the graphite thin film with the surface of the silicon substrate. Instantaneously upon contact of both the surfaces, bonding force worked so that the graphite thin film was firmly bonded to the silicon substrate.

In the aforesaid lamination process comprising a series of direct bonding steps, it is noted that both the graphite thin film and the silicon substrate were neither heated nor cooled. In other words, both the surfaces were brought into contact and laminated one upon another by direct bonding at room or normal temperature.

The graphite thin film and silicon substrate going through the lamination process by direct bonding was then taken out of the normal-temperature bonding apparatus. In this case, the silicon substrate adapted to support the graphite thin film remained affixed to the graphite thin film by virtue of the double-sided tape; the laminated assembly comprised the silicon substrate adapted to support the graphite thin film in place, the double-sided tape, the graphite thin film, and the silicon substrate. Then, this laminated assembly was immersed or dipped in an organic solvent (isopropyl alcohol) to remove the adhesive force of the double-sided tape for removal of the graphite thin film-supporting silicon substrate. Through the aforesaid process there was a laminated assembly formed which comprised a graphite thin film and silicon substrate.

The graphite thin film of the graphite thin film/silicon substrate laminated assembly formed in the aforesaid process was smoothed on its surface by means of CMP, and finished to a surface roughness of up to 1 nm (0.001 μm) or less in terms of JIS arithmetic mean roughness Ra.

Lamination of the laminated assembly comprising the graphite thin film and the silicon substrate, in which the surface of the graphite thin film was polished and smoothed by CMP, and another silicon substrate by means of direct bonding was carried out using a bonding apparatus BOND MEISTER MWB-06-R: a normal-temperature wafer bonding apparatus manufactured by Mitsubishi Heavy Industries Machine Tool Co., Ltd. The laminated assembly comprising the graphite thin film and the silicon substrate, in which the graphite thin film was polished and smoothed on its surface by CMP, was loaded in the bonding chamber of the normal-temperature wafer bonding apparatus. Further, a silicon substrate having a diameter of 100 mm and a thickness of 524 mm, which was to be laminated on the surface of the graphite thin film of the laminated assembly comprising the graphite thin film and the silicon substrate by means of direct bonding, was loaded in the bonding chamber. Then, the bonding chamber was evacuated down to the order of 10$^{-6}$ Pa. In the bonding chamber, the surface of the graphite thin film of the laminated assembly comprising the graphite thin film and the silicon substrate, and the surface of the silicon substrate were then irradiated with neutral argon atoms for removal of surface oxidized films and adsorbates, leading to activation of both the surfaces. This plasma activation process allows the "atomic bond" the materials have inherently to turn up, facilitating spontaneous bonding due to Van der Waals force.

The surface of the graphite thin film of the laminated assembly comprising the graphite thin film and the silicon substrate, and the silicon substrate activated on their surfaces in the activation process were aligned in position within the bonding chamber, followed by contact of the surface of the graphite thin film with the surface of the silicon substrate. Instantaneously upon contact of both the surfaces, bonding force worked so that the surface of the graphite thin film of the laminated assembly comprising the graphite thin film and the silicon substrate was firmly bonded to the silicon substrate.

In the aforesaid lamination process comprising a series of direct bonding steps, it is noted that both the laminated assembly comprising the graphite thin film and the silicon substrate, and the silicon substrate were neither heated nor cooled. In other words, both the surfaces were brought into contact and laminated one upon another by direct bonding at room or normal temperature.

The laminated assembly comprising the graphite thin film and the silicon substrate, and the silicon substrate going through the lamination process by direct bonding was then taken out of the normal-temperature bonding apparatus. Through the aforesaid process there was a laminated assembly obtained which comprised a silicon substrate, a graphite thin film and a silicon substrate and had a diameter of 100 mm.

Measurement of Thickness

The thickness of the thus formed laminated assembly comprising the silicon substrate, the graphite thin film and the silicon substrate was measured. This measurement was carried out using a micrometer. Prior to bonding, the silicon substrate had a thickness of 524 μm and the graphite thin film had a thickness of 100 μm. Formed through the lamination process involving polishing of the graphite thin film by CMP and direct bonding, the laminated assembly comprising the graphite thin film and the silicon substrate had a thickness of 1115 μm. It was thus found that the thickness of the graphite thin film was 67 μm because the silicon substrate was not polished; its thickness was invariable before and after bonding. It was thus found that the amount of polishing of the graphite thin film herein is 33 μm. In the formed laminated assembly comprising the silicon substrate, the graphite thin film and the silicon substrate, the graphite thin film had a thickness of 67 μm and the silicon substrate had a thickness of 524 μm.

Example of Preparing a Laminated Assembly of Silicon Substrate/Graphite Thin Film/Silicon Substrate Having an Oxidized Film Attached Thereto A laminated assembly comprising a silicon substrate, a graphite thin film and a silicon substrate having an oxidized film attached thereto was obtained through a lamination process wherein a graphite thin film smoothed on its surface by means of chemical-mechanical polishing (CMP) is laminated onto a silicon substrate by direct bonding using a normal-temperature bonding apparatus, and the graphite thin film laminated by direct bonding is then smoothed by chemical-mechanical polishing (CMP) on its surface and further laminated onto another silicon substrate having an oxidized film attached thereto with the use of the normal-temperature bonding apparatus, as detailed just below.

For the preparation of a laminated assembly comprising a silicon substrate, a graphite thin film and a silicon substrate having an oxidized film attached thereto, a PGS graphite sheet manufactured by Panasonic Corporation was used. The PGS graphite sheet has a thickness of 100 μm, a size of 180 mm×230 mm, a density of 0.85 g/cm$^3$, a heat conductivity of 700 W/m·k in a planar direction, an electrical conductivity of 10000 S/cm, a tensile strength of 20.0 MPa, a linear expansion coefficient of $9.3 \times 10^{-7}$/k in a planar direction, and a linear expansion coefficient of $3.2 \times 10^{-5}$/k in a thickness direction. This graphite sheet was cut out in a circular shape having a diameter of 100 mm, and then affixed onto a silicon substrate having a diameter of 100 mm and a thickness of 524 μm with the aid of a double-sided tape. The silicon substrate is a support substrate adapted to polish the graphite thin film and to laminate it onto the silicon substrate by means of direct bonding. The graphite thin film was smoothed on its surface by means of CMP, and finished to a surface roughness of up to 1 nm (0.001 μm) or less in terms of JIS arithmetic mean roughness Ra.

Lamination of the graphite thin film polished and smoothed by CMP on the surface and the silicon substrate by means of direct bonding was carried out using a bonding apparatus BOND MEISTER MWB-06-R: a normal-temperature wafer bonding apparatus manufactured by Mitsubishi Heavy Industries Machine Tool Co., Ltd. While the graphite thin film polished by CPM remained affixed to the silicon substrate using the double-sided tape, it was loaded in the bonding chamber of the normal-temperature wafer bonding apparatus. Further, another silicon substrate having a diameter of 100 mm and a thickness of 524 μm, onto which the graphite thin film was laminated by direct bonding, was loaded in the bonding chamber. Then, the bonding chamber was evacuated down to the order of $10^{-6}$ Pa. In the bonding chamber, the surface of the graphite thin film and the surfaces of the silicon substrates were then irradiated with neutral argon atoms for removal of surface oxidized films and adsorbates, leading to activation of both the surfaces. This activation process allows the "atomic bond" the materials have inherently to turn up, facilitating spontaneous bonding due to Van der Waals force.

The graphite thin film and silicon substrates activated on their surfaces in the activation process were aligned in position within the bonding chamber, followed by contact of the surface of the graphite thin film with the surfaces of the silicon substrates. Instantaneously upon contact of both the surfaces, bonding force worked so that the graphite thin film was firmly bonded to the silicon substrate.

In the aforesaid lamination process comprising a series of direct bonding steps, it is noted that both the graphite thin film and the silicon substrates were neither heated nor cooled. In other words, both the surfaces were brought into contact and laminated one upon another by direct bonding at room (or normal) temperature.

The graphite thin film and silicon substrates going through the lamination process by direct bonding was then taken out of the normal-temperature bonding apparatus. In this case, the silicon substrate adapted to support the graphite thin film remained affixed to the graphite thin film by virtue of the double-sided tape; the laminated assembly was made up of the silicon substrate adapted to support the graphite thin film in place, the double-sided tape, the graphite thin film, and the silicon substrate. Then, this laminated assembly was immersed or dipped in an organic solvent (isopropyl alcohol) to remove the adhesive force of the double-sided tape for removal of the graphite thin film-supporting silicon substrate. Through the aforesaid process there was a laminated assembly obtained which comprised a graphite thin film and a silicon substrate and had a diameter of 100 mm.

The graphite thin film of the graphite thin film/silicon substrate laminated assembly formed in the aforesaid process was smoothed on its surface by means of CMP, and finished to a surface roughness of up to 1 nm (0.001 µm) or less in terms of JIS arithmetic mean roughness Ra.

Then, lamination of the graphite thin film/silicon substrate laminated assembly in which the surface of the graphite thin film was polished and smoothed by CMP and a silicon substrate having an oxidized film attached thereto by means of direct bonding was carried out using a bonding apparatus BOND MEISTER MWB-06-R: a normal-temperature wafer bonding apparatus manufactured by Mitsubishi Heavy Industries Machine Tool Co., Ltd. The graphite thin film/silicon substrate laminated assembly in which the graphite thin film was polished and smoothed by CMP on its surface was loaded in the bonding chamber of the normal-temperature wafer bonding apparatus. Further, another silicon substrate having an oxidized film attached thereto and having a diameter of 100 mm and a thickness of 524 µm, onto which the graphite thin film was laminated by direct bonding, was loaded in the bonding chamber. The oxidized film had a thickness of 100 nm. Then, the bonding chamber was evacuated down to the order of $10^{-6}$ Pa. In the bonding chamber, the surface of the graphite thin film of the laminated assembly comprising the graphite thin film and the silicon substrate, and the surface of the silicon substrate having an oxidized film attached thereto were then irradiated with neutral argon atoms for removal of surface oxidized film and adsorbates, leading to activation of both the surfaces. This activation process allows the "atomic bond" the materials have inherently to turn up, facilitating spontaneous bonding due to Van der Waals force.

The surface of the graphite thin film in the laminated assembly comprising the graphite thin film and the silicon substrate activated by the aforesaid process and the silicon substrate and the silicon substrate having an oxidized film attached thereto were aligned in position in the bonding chamber, followed by contact of the surface of the graphite thin film with the surface of the silicon substrate having an oxidized film attached thereto. Instantaneously upon contact of both the surfaces, bonding force worked so that the surface of the graphite thin film in the laminated assembly comprising the graphite thin film and the silicon substrate was firmly bonded to the silicon substrate having an oxidized film attached thereto.

In the aforesaid lamination process comprising a series of direct bonding steps, it is noted that both the laminated assembly comprising the graphite thin film and the silicon substrate, and the silicon substrate having an oxidized film attached thereto were neither heated nor cooled. In other words, both the surfaces were brought into contact and bonded to each other at room or normal temperature.

The laminated assembly comprising the graphite thin film and the silicon substrate, and the silicon substrate having an oxidized film attached thereto going through the lamination process by direct bonding was then taken out of the normal-temperature bonding apparatus. Through the aforesaid process there was a laminated assembly obtained which comprised a silicon substrate, a graphite thin film and a silicon substrate having an oxidized film attached thereto and had a diameter of 100 mm.

Measurement of Thickness

The thickness of the thus formed laminated assembly comprising the silicon substrate, the graphite thin film and the silicon substrate having an oxidized film attached thereto was measured. This measurement was carried out using a micrometer. Prior to bonding, the silicon substrate had a thickness of 524 µm, the silicon substrate having an oxidized film attached thereto had a thickness of 524 µm, and the graphite thin film had a thickness of 100 µm. Formed through the lamination process involving polishing of the graphite thin film by CMP and direct bonding, the laminated assembly comprising the silicon thin film, the graphite thin film, and the silicon substrate having an oxidized film attached thereto had a thickness of 1115 µm. It was found that the thickness of the graphite thin film was 67 µm because the silicon substrate and silicon substrate having an oxidized film attached thereto were not polished; its thickness was invariable before and after bonding. It was thus found that the amount of polishing of the graphite thin film herein is 33 µm. In the laminated assembly comprising the silicon substrate, the graphite thin film, and the silicon substrate having an oxidized film attached thereto, the graphite thin film had a thickness of 67 µm and the silicon substrate had a thickness of 524 µm.

Temperature Distribution of the Silicon Substrate Upon Heated by a Heater

The temperature distribution of the laminated assembly comprising the silicon substrate, the graphite thin film and the silicon substrate having an oxidized film attached thereto was measured upon heated by a heater. It is here noted that the laminated assembly has a diameter of 150 mm, the silicon substrate has a thickness of 625 µm, and the graphite thin film or PGS graphite sheet made by Panasonic Corporation has a thickness of 19 µm. It is again noted that prior to lamination, the graphite thin film has an initial thickness of 100 µm and a thermal conductivity of 700 W/mK.

A small ceramic heater of 15 mm square (ceramic heater MMCPH-15-15 made by MISUMI-VONA and having a 15 mm square, a thickness of 1.27 mm and a maximum operating temperature of 200° C.) was affixed to the silicon surface at the center position of the laminated assembly via a radiating silicon grease (Radiating Silicon SCH-30 made by Sunhayato Co., Ltd.). Electric current was passed through the heater to measure temperatures on the silicon surface by a thermography (made by FLIR Systems, Inc.). The thermography had an emissivity ε of 0.95 (as measured on a matt surface). The measurement was carried out in an environment at room temperature and a humidity of 36%. For comparison purposes, the temperature of a silicon substrate having no graphite thin film laminated thereon was also measured by a ceramic heater affixed thereto.

Figure 7:
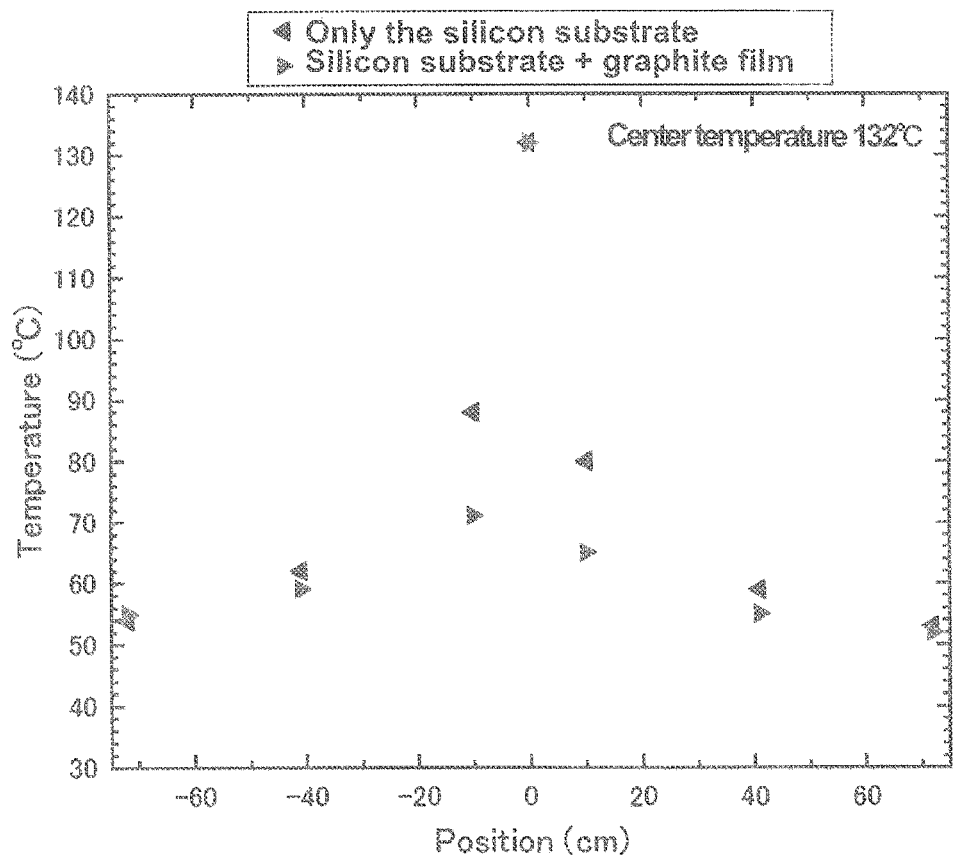
FIG. 7 is a graphical view on the basis of plotting the surface temperature of the silicon substrate of the laminated assembly comprising a graphite thin film and a silicon substrate according to one embodiment of the invention upon heating relative to a distance from the center.

FIG. 7 shows the results of measuring temperatures of the silicon substrate surface as plotted at distances from center when the ceramic heater was operated at 7 W power-on and the temperature of the center site was at 76° C. As measured in a position 10 mm away from center (on both sides of the ceramic heater), temperatures of approximately 55 to 58° C. were observed in the case of only the silicon substrate having no graphite thin film whereas temperatures of 48 to 49° C. were observed in the case of the silicon substrate having a graphite thin film laminated on the back surface.

FIG. 8 shows the results of measuring temperatures of the silicon substrate surface as plotted at distances from center when the ceramic heater was operated at 14 W power-on and the temperature of the center site was at 132° C. As measured in a position 10 mm away from center (on both sides of the ceramic heater), temperatures of approximately 80 to 88° C. were observed in the case of only the silicon substrate free of any graphite thin film whereas temperatures of 65 to 71° C. were observed in the case of the silicon substrate having a graphite thin film laminated on the back surface. As described above, it was identified that the laminated assembly comprising a graphite thin film and a silicon substrate according to the present invention has an enhanced heat dissipating effect.

EXPLANATION OF THE REFERENCE NUMERALS

10: graphite thin film
20: silicon substrate
11: graphite thin film/silicon substrate laminated assembly
12: silicon substrate/graphite thin film/silicon substrate laminated assembly
30: silicon substrate having an oxidized film attached thereto
13: laminated assembly of silicon substrate/graphite thin film/silicon substrate having an oxidized film attached thereto

What is claimed is:

1. A graphite thin film/silicon substrate laminated assembly comprising a silicon substrate, and a graphite thin film provided on the silicon substrate, wherein the silicon substrate and the graphite thin film are brought into contact directly via an interface,
   wherein an intensity of a G-band peak of the graphite thin film in a Raman spectrum is greater than an intensity of a D-band peak of the graphite thin film, and
   wherein the graphite thin film/silicon substrate laminated assembly further comprises a second silicon substrate directly connected to the graphite thin film via a second interface.

2. The graphite thin film/silicon substrate according to claim 1, wherein the silicon substrate and the graphite thin film are bonded together by Van der Walls force.

3. The graphite thin film/silicon substrate according to claim 1, wherein the graphite thin film has a thickness of about 19 μm.

4. The graphite thin film/silicon substrate according to claim 1, wherein the graphite thin film has a thickness of about 67 μm.

5. A process for producing a graphite thin film/silicon substrate laminated assembly according to claim 1, in which the graphite thin film is provided on the silicon substrate, wherein the graphite thin film and the silicon substrate are activated by cleaning on respective surfaces under deaeration conditions to bring the surfaces close to each other for spontaneous bonding.

6. The process for producing a graphite thin film/silicon substrate laminated assembly according to claim 5, wherein prior to deaeration, the surface of the graphite thin film is smoothed by chemical-mechanical polishing (CMP).

7. The process for producing a graphite thin film/silicon laminated assembly according to claim 6, wherein the surface of the graphite thin film is smoothed down to up to 1 nm or less in terms of mean roughness Ra.

8. The process for producing a graphite thin film/silicon substrate laminated assembly according to claim 5, wherein cleaning is carried out by plasma cleaning in the absence of heating.

9. The process for producing a graphite thin film/silicon substrate laminated assembly according to claim 8, wherein the plasma cleaning is an argon plasma.

10. The process for producing a graphite thin film/silicon substrate laminated assembly according to claim 5, wherein the silicon substrate comprises silicon having an oxidized film attached thereto, which is removed by the cleaning.

11. A substrate for a heat discharge enhanced electronic device comprising a laminated assembly comprising a silicon substrate and a graphite thin film provided on the silicon substrate, wherein the silicon substrate and the graphite thin film come into contact with each other directly via an interface,
   wherein an intensity of a G-band peak of the graphite thin film in a Raman spectrum is greater than an intensity of a D-band peak of the graphite thin film, and
   wherein the laminated assembly further comprises a second silicon substrate directly connected to the graphite thin film via a second interface.

* * * * *